(12) United States Patent
Harris

(10) Patent No.: US 7,977,721 B2
(45) Date of Patent: Jul. 12, 2011

(54) HIGH VOLTAGE TOLERANT METAL-OXIDE-SEMICONDUCTOR DEVICE

(75) Inventor: Edward B. Harris, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/112,076

(22) Filed: Apr. 30, 2008

(65) Prior Publication Data
US 2009/0273012 A1 Nov. 5, 2009

(51) Int. Cl.
*H01L 29/94* (2006.01)
(52) U.S. Cl. ..... 257/300; 326/85; 327/108; 257/E21.09; 257/E29.345
(58) Field of Classification Search .......... 257/300, 257/E27.071, 60, 135, 220, 263, 302, 328, 257/329; 365/149; 307/109; 323/242; 327/61, 327/108–112, 434, 8; 331/36 C; 326/85, 326/87
See application file for complete search history.

(56) References Cited

U.S. PATENT DOCUMENTS

| 4,703,196 | A | * | 10/1987 | Arakawa | 327/126 |
| 4,804,863 | A | * | 2/1989 | Welland et al. | 327/127 |
| 6,133,897 | A | * | 10/2000 | Kouchi | 345/100 |
| 6,388,475 | B1 | | 5/2002 | Clark et al. | |
| 7,245,519 | B2 | | 7/2007 | McQuirk et al. | |
| 2002/0175743 | A1 | * | 11/2002 | Ajit | 327/534 |
| 2009/0067218 | A1 | * | 3/2009 | Graber | 365/149 |
| 2010/0020648 | A1 | * | 1/2010 | La Rosa | 368/107 |

FOREIGN PATENT DOCUMENTS
JP 60-170768 * 9/1985
* cited by examiner

*Primary Examiner* — A. Sefer
(74) *Attorney, Agent, or Firm* — Ryan, Mason & Lewis, LLP

(57) ABSTRACT

A method for increasing a voltage tolerance of a MOS device having a first capacitance value associated therewith is provided. The method includes the steps of: connecting at least a first capacitor in series with the MOS device, the first capacitor having a first capacitance value associated therewith, the first capacitor having a first terminal coupled to a gate of the MOS device and a second terminal adapted to receive a first signal; and adjusting a ratio of the first capacitance value and a second capacitance value associated with the MOS device such that a second signal present at the gate of the MOS device will be an attenuated version of the first signal. An amount of attenuation of the first signal is a function of the ratio of the first and second capacitance values.

15 Claims, 1 Drawing Sheet

HIGH VOLTAGE TOLERANT METAL-OXIDE-SEMICONDUCTOR DEVICE

FIELD OF THE INVENTION

The present invention relates generally to the electrical and electronic arts, and more particularly relates to metal-oxide-semiconductor (MOS) devices.

BACKGROUND OF THE INVENTION

MOS transistor devices are well known and are used in a wide variety of electronic systems and applications. In advanced complementary metal-oxide-semiconductor (CMOS) integrated circuit (IC) process technology, there has been a push toward using lower voltage transistors. In a 40 nanometer (nm) IC fabrication process, for example, 1.8-volt transistors are being readily adopted. However, despite the push to utilize lower voltage transistors, there is still a need for high voltage tolerance in certain applications (e.g., fail-safe input/output (IO) circuits) that may require interfacing with higher voltages (e.g., 5 volts).

One problem effecting MOS transistors used in a high voltage application is that the gate oxide of a MOS transistor device typically cannot tolerate the application of a high voltage signal to the gate of the device. Two reliability mechanisms known to contribute to gate oxide failure in a MOS device include negative bias temperature instability (NBTI) and time dependent dielectric breakdown (TDDB).

Conventional high voltage tolerant 10 interface circuits typically employ stacked metal-oxide-semiconductor (MOS) devices. An example of this configuration is described in U.S. Pat. No. 6,388,475 to Clark et al. While this circuit configuration may help alleviate overvoltage stress on individual devices by distributing the voltage across two or more devices, some high voltage tolerant failsafe specifications require that the circuit tolerate a prescribed voltage even when power to the circuit is removed. This creates a problem for the stacked MOS device approach. Additionally, using stacked MOS devices often requires complex bias generation circuitry and utilizes more area in the IC compared to a non-stacked device arrangement and is therefore undesirable.

Another known approach to forming a high voltage tolerant MOS device is to increase a thickness of the oxide in the MOS device to accommodate the higher voltage. One disadvantage of this approach, however, is that it requires additional IC fabrication steps, which increase overall cost.

Accordingly, there exists a need for a high voltage tolerant MOS transistor which does not suffer from one or more of the above-noted problems associated with conventional MOS transistors.

SUMMARY OF THE INVENTION

Illustrative embodiments of the invention meet the above-noted need by providing a MOS circuit having improved tolerance to high voltage signals. Techniques of the present invention beneficially eliminate the need for stacking MOS devices or increasing gate oxide thickness. To accomplish this, embodiments of the invention utilize a capacitive voltage divider arrangement coupled to a MOS transistor for controlling the amount of attenuation of an input signal applied to the MOS circuit. Moreover, techniques of the invention provide such improved high voltage tolerance using standard CMOS processing technology, and therefore do not add any significant cost compared to conventional methodologies.

In accordance with one aspect of the invention, a method for increasing a voltage tolerance of a MOS device having a first capacitance value associated therewith is provided. The method includes the steps of: connecting at least a first capacitor in series with the MOS device, the first capacitor having a first capacitance value associated therewith, the first capacitor having a first terminal coupled to a gate of the MOS device and a second terminal adapted to receive a first signal; and adjusting a ratio of the first capacitance value and a second capacitance value associated with the MOS device such that a second signal present at the gate of the MOS device will be an attenuated version of the first signal. An amount of attenuation of the first signal is a function of the ratio of the first and second capacitance values.

In accordance with another aspect of the invention, an apparatus for increasing a voltage tolerance of a MOS device having a gate adapted for connection to the apparatus is provided. The apparatus includes at least one capacitive element having a second capacitance value associated therewith, and a controller connected to the at least one capacitive element. The controller is operative to adjust a ratio of a first capacitance value associated with the MOS device and the second capacitance value so as to reduce, by a first amount, a voltage potential of a first signal present at the gate of the MOS device, the first amount being a function of the ratio of the first and second capacitance values.

In accordance with yet another embodiment of the invention, an information recording medium recording design data of a circuit for increasing a voltage tolerance of a MOS device in a computer-readable manner is provided. The design data specifies at least one capacitive element having a first capacitance value associated therewith, the at least one capacitive element having a first terminal coupled to a gate of the MOS device and a second terminal adapted to receive a first signal; and a controller coupled to the at least one capacitive element. The controller is operative to control a ratio of the first capacitance value and a second capacitance value associated with the MOS device such that a second signal present at the gate of the MOS device will be an attenuated version of the first signal, an amount of attenuation of the first signal being a function of the ratio of the first and second capacitance values.

These and other features, aspects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of exemplary circuits for advantageously increasing the voltage tolerance of a MOS device. It is to be understood, however, that the techniques of the present invention are not limited to the circuits shown and described herein. Rather, embodiments of the invention may be implemented in any application that can benefit from a MOS device having increased tolerance to high voltage. Although preferred embodiments of the invention may be fabricated in a silicon wafer, embodiments of the invention can alternatively be fabricated in wafers comprising other materials, including but not limited to Gallium Arsenide (GaAs), Indium Phosphide (InP), etc.

Figure 1:
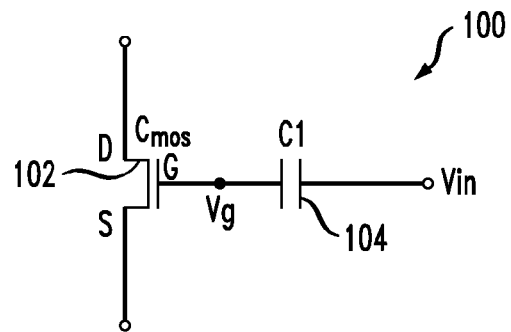
FIG. 1 is a schematic diagram illustrating at least a portion of an exemplary MOS circuit having increased voltage tolerance, in accordance with an embodiment of the present invention.

FIG. 1 is a schematic diagram illustrating at least a portion of an exemplary MOS circuit 100 having increased voltage tolerance compared to a standard MOS device, according to an embodiment of the present invention. MOS circuit 100 includes a MOS transistor 102 (e.g., MOS field-effect transistor (MOSFET)) and at least one capacitor 104 coupled to the MOS transistor. More particularly, MOS transistor 102 includes a drain (D) forming a first terminal of the MOS circuit 100, a source (S) forming a second terminal of the circuit, and gate (G) connected to a first terminal of capacitor 104. A second terminal of capacitor 104 is adapted for receiving an input signal, Vin, supplied to the MOS circuit 100 and forms a third terminal of the MOS circuit, which may be an input terminal. Capacitor 104 preferably resides proximate to MOS transistor 102. Alternatively, capacitor 104 may reside at one or more (e.g., in the case of a distributed capacitor) locations throughout an integrated circuit (IC) in which the MOS circuit 100 is formed.

Capacitor 104 is preferably a metal plate capacitor (e.g., two metal plates separated by dielectric material, such as silicon dioxide), although it is not limited to any particular type of capacitor. Furthermore, while shown as a discrete component, capacitor 104 may alternatively, or in addition to, comprise parasitic capacitances, such as, for example, capacitance associated with interconnect coupled to the gate of MOS transistor 102. Although shown as including one capacitor 104 coupled to the gate of transistor 102, MOS circuit 100 is not limited to a single capacitor, but may include essentially any number of capacitors coupled to the gate of the MOS transistor either in series, parallel, or a combination of series and parallel configuration, as will be described below in conjunction with FIG. 2.

MOS transistor 102 has an inherent capacitance, $C_{mos}$, associated therewith. Generally, the capacitance $C_{mos}$ attributed to a MOS transistor device can be separated into three types. The first type includes capacitance associated with a back-biased depletion region between the drain and substrate (bulk) and between the source and substrate, $C_{BD}$ and $C_{BS}$, respectively, in the device. The second type includes capacitance common to the gate, namely, $C_{GD}$, $C_{GS}$ and $C_{GB}$, which are dependent upon the operating conditions of the device. The third type includes parasitic capacitances which are generally independent of the operating conditions. With respect to the gate of MOS transistor 102, the primary large-signal, charge-storage capacitors associated with MOS transistor 102 include gate-to-source ($C_{GS}$), gate-to-drain ($C_{GD}$), and gate-to-bulk ($C_{GB}$) capacitances.

The capacitance $C_{mos}$ of MOS transistor 102 may be controlled by selectively changing one or more characteristics of the device. For example, the value of capacitance $C_{mos}$ can be modified by changing at least one dimension of a channel region in the device (e.g., changing a ratio of effective channel width to effective channel length of the device), a type of material forming a dielectric layer between the gate and the channel region or between the gate and a source and/or drain region in the device (e.g., gate oxide), etc., as will be apparent to those skilled in the art.

With the connection arrangement of the MOS circuit 100 shown in FIG. 1, a voltage, Vg, appearing at the gate of MOS transistor 102 will be an attenuated version of the input signal Vin. More particularly, a capacitive voltage divider is formed between capacitor 104 and the capacitance $C_{mos}$ of MOS transistor 102. Thus, the effective voltage Vg appearing at the gate of MOS transistor 102 will be determined primarily by a ratio of a capacitance, C1, associated with capacitor 104 and capacitance $C_{mos}$ according to the following relation:

$$Vg = Vin \cdot \left(\frac{C1}{C1 + C_{mos}}\right).$$

The effective voltage Vg appearing at the gate of MOS transistor 102 will always be less than the magnitude of the input signal Vin, assuming the MOS transistor has a nonzero capacitance, which is a realistic assumption. Thus, by controlling capacitance C1 and/or the capacitance $C_{mos}$ of MOS transistor 102, a desired amount of attenuation of the input signal Vin applied to the MOS circuit 200 can be beneficially attained.

Figure 2:
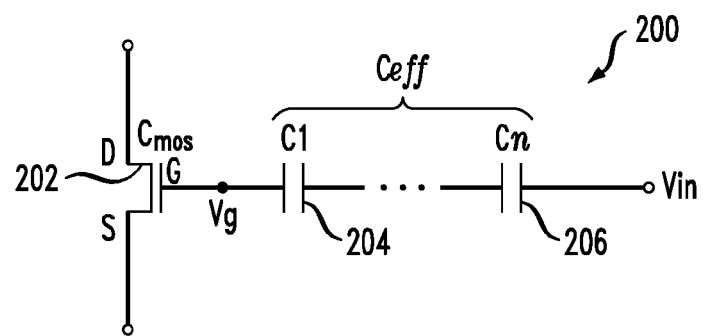
FIG. 2 is a schematic diagram illustrating at least a portion of an exemplary MOS circuit having increased voltage tolerance, in accordance with another embodiment of the present invention.

FIG. 2 is a schematic diagram depicting an exemplary MOS circuit 200, according to another embodiment of the invention. MOS circuit 200 includes a MOS transistor 202 and a plurality of capacitors, 204 through 206, having capacitances C1 through Cn, respectively, coupled to the MOS transistor, where n is an integer greater than one. MOS transistor 202 may be similar to MOS transistor 102 shown in FIG. 1. More particularly, MOS transistor 202 includes a drain forming a first terminal of the MOS circuit 200, a source forming a second terminal of the circuit, and gate connected to a first terminal of capacitor 204. A second terminal of capacitor 204 is connected to a terminal of a next subsequent capacitor of the plurality of capacitors, a first terminal of capacitor 206 is connected to a terminal of a next preceding capacitor in the plurality of capacitors. A second terminal of capacitor 206 is adapted for receiving an input signal, Vin, supplied to the MOS circuit 200 and forms a third terminal of the MOS circuit, which may be an input terminal. It is to be appreciated that, although shown as being connected in series, capacitors 204 through 206 may alternatively be coupled together in parallel or in a combination of a parallel and a series configuration.

Like MOS transistor 102 depicted in FIG. 1, MOS transistor 202 has an inherent capacitance, $C_{mos}$, associated therewith. An effective capacitance, Ceff, of the plurality of capacitors 204 through 206 may be determined by the following expression:

$$Ceff = \frac{1}{\frac{1}{C1} + \ldots + \frac{1}{Cn}},$$

With the connection arrangement of MOS circuit 200, a voltage, Vg, appearing at the gate of MOS transistor 202 will be an attenuated version of the input signal Vin. More particularly, a capacitive voltage divider is formed between the capacitance $C_{mos}$ of MOS transistor 202 and the effective capacitance Ceff of the plurality of capacitors 204 through 206 coupled to the MOS transistor. Thus, in a manner similar to MOS circuit 100 shown in FIG. 1, the effective voltage Vg appearing at the gate of MOS transistor 202 will be determined primarily by a ratio of capacitance Ceff and capacitance $C_{mos}$ according to the following relation:

$$Vg = Vin \cdot \left( \frac{Ceff}{Ceff + C_{mos}} \right).$$

Assuming $C_{mos}$ is nonzero, the effective voltage Vg appearing at the gate of MOS transistor 202 will always be less than the magnitude of the input signal Vin. Thus, by selectively changing one or more of the capacitances C1 through Cn and/or the capacitance $C_{mos}$ of MOS transistor 202, a desired amount of attenuation of the input signal Vin applied to the MOS circuit 200 can be advantageously achieved.

Figure 3:
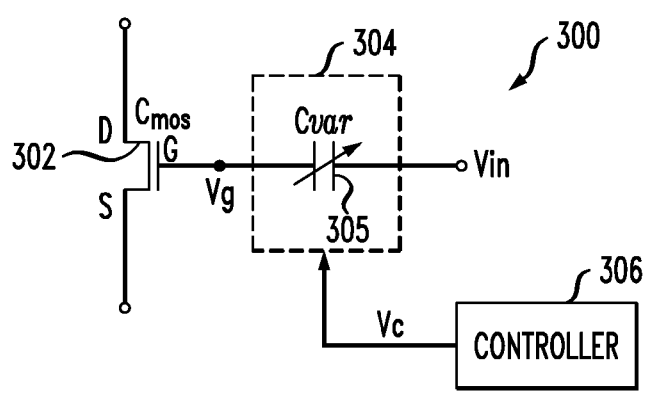
FIG. 3 is a schematic diagram illustrating at least a portion of an exemplary MOS circuit having increased voltage tolerance, in accordance with another embodiment of the present invention.

With reference now to FIG. 3, a schematic diagram illustrates at least a portion of an exemplary MOS circuit 300 having increased voltage tolerance, in accordance with another aspect of the present invention. MOS circuit 300 includes a MOS transistor 302 and a programmable capacitor 304 coupled to the MOS transistor. More particularly, MOS transistor 302 includes a drain forming a first terminal of the MOS circuit 300, a source forming a second terminal of the circuit, and gate connected to a first terminal of programmable capacitor 304. A second terminal of programmable capacitor 304 is adapted for receiving an input signal, Vin, supplied to the MOS circuit 300 and forms a third terminal of the MOS circuit, which may be an input terminal.

Programmable capacitor 304 preferably comprises at least one capacitive element 305 having a capacitance, Cvar, which is controllable as a function of a control signal, Vc, applied to the programmable capacitor. In one embodiment, programmable capacitor 304 may comprise a digitally programmable capacitor, in which case control signal Vc may comprise a digital signal (e.g., digital code) indicative of a prescribed capacitance value. Digitally programmable capacitors suitable for use with the present invention are known as described, for example, in U.S. Pat. No. 7,245,519 to McQuirk et al., the disclosure of which is incorporated by reference herein. Signal Vc for controlling the value of capacitance Cvar may be generated externally to the MOS circuit 300. Alternatively, MOS circuit 300 may include a controller 306 coupled to programmable capacitor 304 and operative to internally generate the control signal Vc.

Where programmable capacitor 304 is a digitally programmable capacitor array, controller 306 may comprise, for example, a counter and corresponding decode logic. The programmable capacitor array may include a plurality of capacitive units connected together in parallel. At one end of each capacitive unit is a corresponding electronic switch that connects the capacitive unit to a sum capacitor. The counter is preferably operative to count up or down, either incrementing or decrementing, respectively, the value of capacitance Cvar, as a function of an up/down control signal supplied to the controller 306. The output of the counter may be decoded by the decode logic to activate one or more switches in the programmable capacitor array, thereby connecting one or more corresponding capacitive units to the sum capacitor to obtain a desired value for capacitance Cvar. The contents of the counter may be optionally stored in nonvolatile memory. In this manner, when the programmable capacitor 304 is powered down, the last counter value will be maintained in memory. When power is restored, the contents of the memory are recalled and the programmable capacitor 304 set to the last stored value.

MOS transistor 302 has an inherent capacitance, $C_{mos}$, associated therewith. Using the connection arrangement of MOS circuit 300, a voltage, Vg, appearing at the gate of MOS transistor 302 will be an attenuated version of the input signal Vin. More particularly, a capacitive voltage divider is formed between programmable capacitor 304 and the capacitance $C_{mos}$ of MOS transistor 102. The effective voltage Vg appearing at the gate of MOS transistor 302 will be primarily a function of a ratio of the capacitance Cvar of programmable capacitor 304 and capacitance $C_{mos}$ of MOS transistor 302 according to the following relation:

$$Vg = Vin \cdot \left( \frac{Cvar}{Cvar + C_{mos}} \right).$$

The voltage Vg appearing at the gate of MOS transistor 302 will always be less than the magnitude of the input signal Vin, assuming the MOS transistor has a nonzero capacitance, which is a valid assumption. Thus, by controlling capacitance Cvar of programmable capacitor 304 and/or the capacitance $C_{mos}$ of MOS transistor 302, a desired amount of attenuation of the input signal Vin applied to the MOS circuit 300 can be beneficially attained. Furthermore, using the circuit arrangement shown in FIG. 3, the amount of attenuation of the input signal Vin can be changed "on-the-fly" by application of one or more appropriate control signals to controller 306.

At least a portion of the techniques of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An integrated circuit in accordance with the present invention can be employed in any application and/or electronic system which utilizes a MOS device requiring a high voltage tolerance. Suitable systems for implementing techniques of the invention may include, but are not limited to, personal computers, communication networks, electronic instruments (e.g., automated test equipment (ATE)), interface networks, display systems, etc. Systems incorporating such integrated circuits are considered part of this invention. Given the teachings of the invention provided herein, one of ordinary skill in the art will be able to contemplate other implementations and applications of the techniques of the invention. For example, portions of the invention may be embodied on an information recording medium recording design data of a circuit for increasing the voltage tolerance of a MOS device in a computer-readable manner.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. Apparatus for increasing a voltage tolerance of a metal-oxide-semiconductor (MOS) device coupled to the apparatus, the apparatus comprising:

at least one capacitive element having a first capacitance value associated therewith, the at least one capacitive element having a first terminal coupled to a gate of the MOS device and a second terminal adapted to receive a first signal; and a controller coupled to the at least one capacitive element, the controller being operative to adjust a ratio of the first capacitance value and a second capacitance value associated with the MOS device, wherein a second signal present at the gate of the MOS device is an attenuated version of the first signal, an amount of attenuation of the first signal being a function of the ratio of the first and second capacitance values.

2. The apparatus of claim 1, wherein the at least one capacitive element comprises a programmable capacitor such that the first capacitance value is controllable as a function of a first control signal generated by the controller.

3. The apparatus of claim 1, wherein the at least one capacitance element comprises a plurality of capacitors connected together in at least one of a series and a parallel arrangement, the controller being operative to adjust a ratio of respective capacitance values of the plurality of capacitors and the second capacitance value so as to control a voltage potential of the second signal present at the gate of the MOS device.

4. The apparatus of claim 1, wherein the second capacitance value corresponds to a gate capacitance of the MOS device.

5. The apparatus of claim 1, wherein the controller is operative to detect a magnitude of the first signal and to adjust the ratio of the first and second capacitance values as a function of the magnitude of the first signal.

6. The apparatus of claim 1, wherein the controller is operative to adjust the first capacitance value relative to the second capacitance value to thereby control the ratio of the first and second capacitance values.

7. An integrated circuit including at least one apparatus according to claim 1.

8. The apparatus of claim 1, wherein the at least one capacitive element is coupled to a single terminal of the MOS device, said single terminal comprising the gate of the MOS device.

9. Apparatus for increasing a voltage tolerance of a metal-oxide-semiconductor (MOS) device coupled to the apparatus, the apparatus comprising:

at least one capacitive element having a first capacitance value associated therewith, the at least one capacitive element having a first terminal coupled to a gate of the MOS device and a second terminal adapted to receive a first signal; and a controller coupled to the at least one capacitive element, the controller being operative to adjust the first capacitance value, wherein a second signal present at the gate of the MOS device is an attenuated version of the first signal, an amount of attenuation of the first signal being a function of a ratio of the first capacitance value and a second capacitance value associated with the MOS device.

10. The apparatus of claim 9, wherein the at least one capacitive element comprises a programmable capacitor such that the first capacitance value is controllable as a function of a first control signal generated by the controller.

11. The apparatus of claim 9, wherein the at least one capacitance element comprises a plurality of capacitors connected together in at least one of a series and a parallel arrangement, the controller being operative to adjust respective capacitance values of the plurality of capacitors so as to control a voltage potential of the second signal present at the gate of the MOS device.

12. The apparatus of claim 9, wherein the second capacitance value corresponds to a gate capacitance of the MOS device.

13. The apparatus of claim 9, wherein the controller is operative to detect a magnitude of the first signal and to adjust the first capacitance value as a function of the magnitude of the first signal.

14. An integrated circuit including at least one apparatus according to claim 9.

15. The apparatus of claim 9, wherein the at least one capacitive element is coupled to a single terminal of the MOS device, said single terminal comprising the gate of the MOS device.

* * * * *